United States Patent
Abdoli et al.

(10) Patent No.: US 9,692,619 B2
(45) Date of Patent: Jun. 27, 2017

(54) NON-UNDERDETERMINED ESTIMATION FOR COMPRESSED SENSING

(71) Applicants: Javad Abdoli, Ottawa (CA); Ming Jia, Ottawa (CA)

(72) Inventors: Javad Abdoli, Ottawa (CA); Ming Jia, Ottawa (CA)

(73) Assignee: Huawei Technologies Co., Ltd., Shenzhen (CN)

(*) Notice: Subject to any disclaimer, the term of this patent is extended or adjusted under 35 U.S.C. 154(b) by 221 days.

(21) Appl. No.: 14/596,680

(22) Filed: Jan. 14, 2015

(65) Prior Publication Data
US 2016/0204963 A1   Jul. 14, 2016

(51) Int. Cl.
*G06F 7/38* (2006.01)
*H04L 25/03* (2006.01)
*H03M 7/30* (2006.01)

(52) U.S. Cl.
CPC .... *H04L 25/03286* (2013.01); *H03M 7/3062* (2013.01); *H04L 25/03178* (2013.01); *H04L 2025/03636* (2013.01)

(58) Field of Classification Search
CPC .................................................. H04L 25/03286
USPC ........................................................ 708/441
See application file for complete search history.

(56) References Cited

U.S. PATENT DOCUMENTS

| 2008/0227397 A1* | 9/2008 | Prasad ............... H04B 1/71055 455/63.1 |
| 2012/0249353 A1* | 10/2012 | Khajehnejad ....... H03M 7/3062 341/144 |
| 2013/0070831 A1 | 3/2013 | Tulino et al. |

FOREIGN PATENT DOCUMENTS

| CN | 102724020 A | 10/2012 |
| CN | 103840838 A | 6/2014 |
| CN | 103997347 A | 8/2014 |

OTHER PUBLICATIONS

PCT International Search Report, PCT/CN2016/070158, Mar. 24, 2016, 11 pages.

(Continued)

*Primary Examiner* — Tan V. Mai

(57) ABSTRACT

Nonzero elements of a signal vector, which may be a sparse signal vector, may be determined based on an observation vector representing a set of underdetermined observations using a compressed sensing optimization and a non-underdetermined estimation method such as iterative linear minimum mean-square error ("LMMSE") estimation. Compressed sensing optimization may be used to obtain a subset of potentially nonzero elements of the signal vector, and LMMSE estimation may then be used to find the nonzero elements among the potentially nonzero elements. The identification of nonzero elements may then be used to recover the signal vector from the observation vector. This technique is useful for recovering compressed data such as a sparse frequency space representation of audio or video data from a measurement. The technique is also useful for identifying at a base station a relatively small number active devices in an overloaded communication network.

30 Claims, 6 Drawing Sheets

(56) References Cited

OTHER PUBLICATIONS

Donoho, "Compressed Sensing", IEEE Transactions on Information Theory, Apr. 2006, vol. 52, No. 4, pp. 1289-1306.
Efron et al., "Least Angle Regression", The Annals of Statistics, 2004, vol. 32, No. 2, pp. 407-499.
Friedman et al., "Pathwise Coordinate Optimization", The Annals of Applied Statistics, 2007, vol. 1, No. 2, pp. 302-332.

\* cited by examiner

NON-UNDERDETERMINED ESTIMATION FOR COMPRESSED SENSING

FIELD

The present disclosure relates to reconstruction of sparse signals in communications and signal processing applications.

BACKGROUND

In digital communications and signal processing applications, continuous physical phenomena, or signals, such as electromagnetic waves, are used for encoding digital information. Recovery of the digital signal encoded in the continuous physical signal consists in sampling the continuous signal at some sampling rate. Conventional sampling methods typically require a sampling rate of at least twice the maximum frequency in the continuous signal, also known as the Nyquist sampling rate, for reliable digital signal reconstruction. In many applications, however, processing cost is related to the sampling rate, and it is therefore desirable to develop techniques which enable reduction of the measurement sampling rate.

Recovery of a digital signal by sampling an encoded continuous signal at sub-Nyquist sampling rates is possible if it is known or expected that the digital signal is sparse, meaning that many of the coefficients of the signal are equal to zero or nearly so. This technique is known as compressed sensing. The assumption of sparsity is an additional constraint which may enable a solution to the problem.

Recovering a sparse signal from an underdetermined set of observations is a Non-deterministic Polynomial-time hard (NP-hard) problem, but may be rendered a convex optimization problem if an $l_1$ norm is used as the sparsifying norm. A number of algorithms for solving this optimization problem have been proposed. Some known algorithms employ the least absolute shrinkage and selection operator ("Lasso") version of the least squares method. Two such known algorithms include least-angle regression (LARS) and coordinate descent (CD). These algorithms suffer from certain limitations, however. Firstly, they do not solve the original compressed sensing problem because it is NP-hard. Secondly, because of their sensitivity to certain parameters, they do not necessarily find an optimum solution to the problem after a given number of iterations. In addition, known iterative compressed sensing algorithms tend to increase in complexity with each iteration thus adding processing cost to the attainment of increasingly better estimates of the digital signal elements.

It remains desirable, therefore, to develop improved techniques for recovery of sparse signals using compressed sensing algorithms having lower complexity and processing cost.

SUMMARY

Embodiments disclosed herein overcome or ameliorate disadvantages of prior methods, provide additional capabilities or advantages, or provide alternative means for producing desirable results.

In general, a conventional compressed sensing algorithm may be used to obtain a subset of potentially nonzero elements of a signal vector. Then, a non-underdetermined estimation method such as iterative linear minimum mean-square error optimization may be used to find the nonzero elements among the potentially nonzero elements. The non-underdetermined estimation method may be less computationally intensive than the conventional compressed sensing algorithm, and may also more quickly resolve the nonzero elements of the signal vector.

In one embodiment, a signal vector, which may be a sparse signal vector, may be recovered from an observation vector including a set of observations. The signal may encode a signal vector having a number of nonzero elements. A number of elements of the observation vector may be less than a total number of elements of the signal vector. In one embodiment, the number of elements of the observation vector is greater than the number of nonzero elements of the signal vector. A signal vector estimate may be generated based on the observation vector and an observation matrix using compressed sensing optimization. The observation matrix describes a relationship between the observation vector and the signal vector. An index set of most dominant elements of the signal vector estimate may be determined according to a sparsifying norm. A number of the most dominant elements is at most the number of the elements of the observation vector, and in one embodiment is greater than the number of the nonzero elements of the signal vector. In one embodiment, the number of the most dominant elements is less than the number of the elements of the observation vector. An index set of the nonzero elements of the signal vector may be generated by performing a non-underdetermined estimation method, which may be iterative linear minimum mean-square error optimization, based on the observation matrix, the observation vector, and the index set of the most dominant elements of the signal vector estimate.

The general outline provided above enables a better understanding of the detailed description of embodiments which follows. Such embodiments include additional features and advantages, and it will be appreciated by persons of ordinary skill in the art that the particular embodiments described below may be modified or built upon to perform the same functions and provide the same results set forth herein while not departing from the spirit and scope of the subject matter set forth in the appended claims.

BRIEF DESCRIPTION OF THE DRAWINGS

Embodiments of the present disclosure will now be described, by way of example only, with reference to the attached Figures.

DETAILED DESCRIPTION

Figure 1:
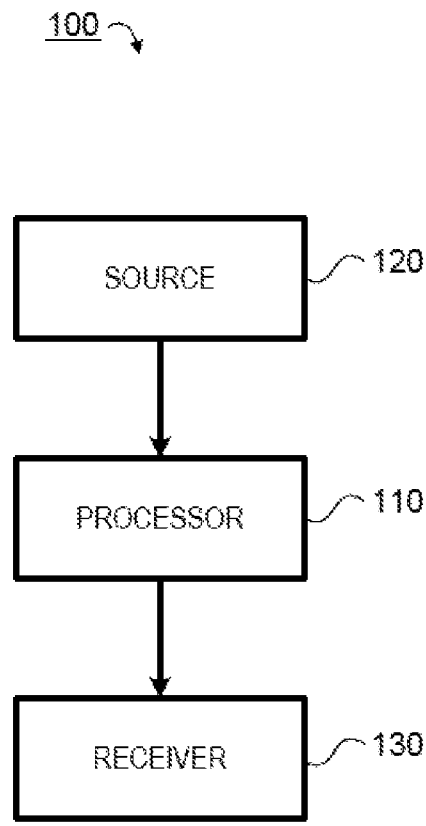
FIG. 1 is a block diagram of a system according to embodiments disclosed herein.

Particular embodiments will now be described in a context of communications and signal processing systems wherein compressed sensing of signal data is employed. It will be appreciated by persons of ordinary skill in the art, however, that the principles set forth herein may be applied to adapt the embodiments to any content wherein signals or data are compressively sampled.

In general, a digital signal x may be encoded in some physical phenomenon characterized by a continuous signal, and the digital signal x may be recovered from an observation y of the continuous signal by solving the following relation:

$$y_{m \times p} = A_{m \times n} x_{n \times p} \qquad (1)$$

where A is an operator, which may be termed the 'observation matrix', describing the relationship between the observation y and the encoded digital signal x. Where the system is non-underdetermined, or in other words fully determined or overdetermined, i.e. m≥n, a unique solution for x is in principle possible if the operator A is full-rank. However, in practice it is ordinarily required to employ optimization methods to determine an estimate of the digital signal x.

In particular, where the number of measurements m in observation y is less than the number of elements n in the digital signal x such that m<n, the problem is underdetermined, and in principle a unique solution for x is not possible. If, however, x is known or expected to be s-sparse, meaning it contains a relatively small number s of nonzero elements such that s<<n, then this additional constraint may enable a solution. Recovery of an s-sparse signal from an underdetermined set of observations is known as compressed sensing. Although the number m of observations is less than the number of elements n of the signal x, and s<m<n, it remains possible to recover the signal x because of the sparsity constraint. For example, compressed sensing is a technique which may be used for digital signal recovery from continuous signals at sampling rates below the Nyquist rate.

The problem of recovering an s-sparse vector x from an underdetermined set of linear observations y may be addressed by using convex-optimization compressed sensing algorithms. Some such algorithms employ the least absolute shrinkage and selection operator ("Lasso") version of the least squares method, also known as the unconstrained basis pursuit denoising problem (UBPDN):

$$\min_x \frac{1}{2} \|y - Ax\|_2^2 + \lambda \|x\|_1 \qquad (2)$$

Two such known algorithms include least-angle regression (LARS) and coordinate descent (CD) algorithms. These algorithms suffer from certain limitations, however, and it remains desirable to provide improved techniques for reconstruction of sparse signals using compressed sensing algorithms having lower complexity and processing cost.

An improved method of signal recovery may use a conventional compressed sensing algorithm to generate an estimate $\hat{x}$ of a signal x, and based either on a prior knowledge of the number of nonzero elements of the signal x, or a separate method for estimating such number, a subset of k potentially nonzero elements may be selected, where k≤m, where m is the number of observations. As such, the optimization problem is no longer underdetermined. Following this selection of k potentially nonzero elements, a further method different from the compressed sensing algorithm may be used to solve the non-underdetermined optimization problem, but may now be selected without limitation by the constraint of an underdetermined system. In particular, a non-underdetermined estimation method may be used, wherein the non-underdetermined estimation method is any method suitable for estimating the solution to a system of equations that is not underdetermined. The non-underdetermined estimation method may be less computationally intensive than compressed sensing algorithms and may more quickly resolve the nonzero elements of the signal x. In some embodiments, the non-underdetermined estimation method is an iterative linear minimum mean-square error (LMMSE) algorithm used to find the nonzero elements among the k potentially nonzero elements. In other embodiments, other non-underdetermined estimation methods may be used, such as zero-forcing (ZF).

In view of the foregoing, a system 100 for signal recovery using compressive sensing will now be described with reference to FIG. 1, and a method 200 of using the system 100 will now be described with reference to FIG. 2.

Figure 2:
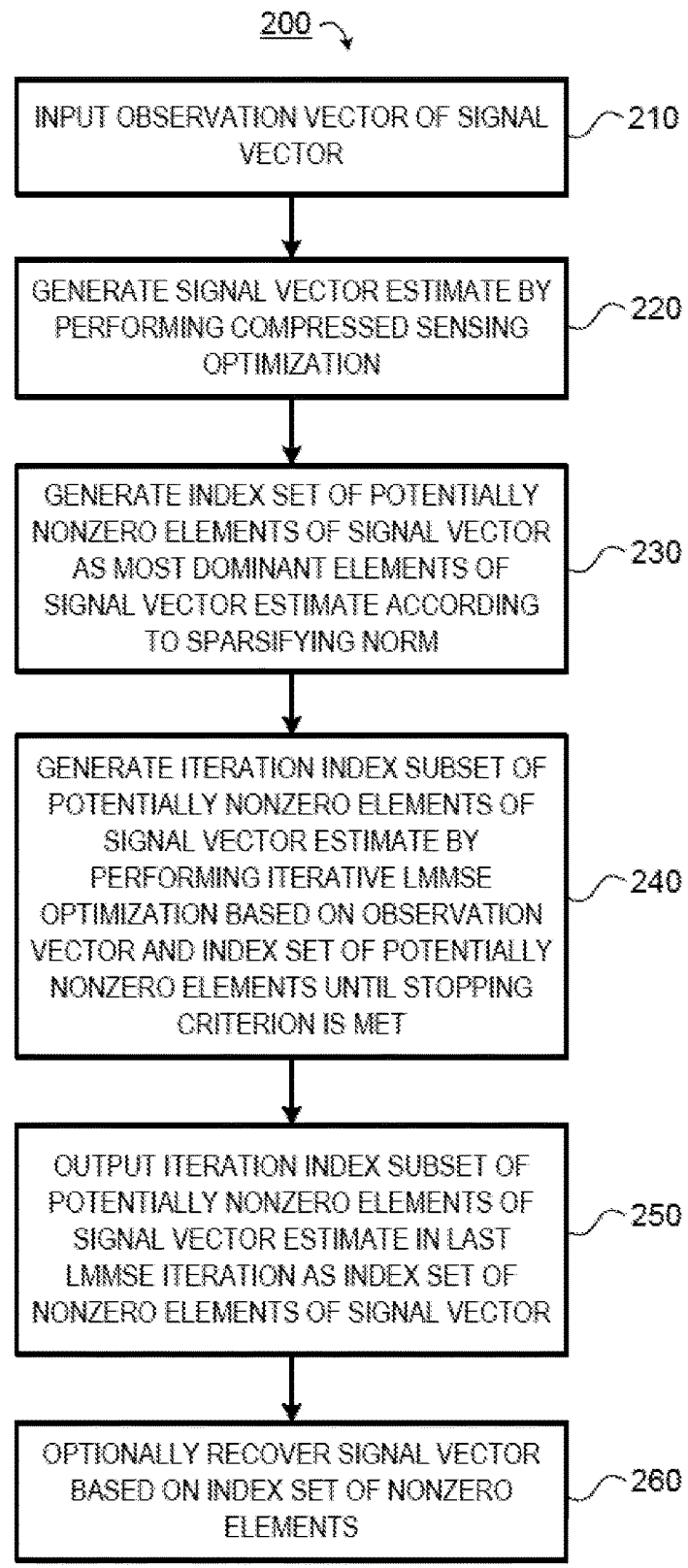
FIG. 2 is a flowchart of a method for determining nonzero elements of a sparse signal vector from an underdetermined observation vector according to embodiments disclosed herein.

As shown in FIG. 1, the system 100 comprises a processor 110 which inputs, or receives, an observation y of a signal x from a source 120 (step 210). The processor 110 is configured to perform the method 200 shown in FIG. 2, and outputs, or sends, an index subset $\mathcal{J}$ identifying the nonzero elements of signal x (step 250), and also optionally a signal estimate subset $\hat{x}_{\mathcal{J}}$ including a subset of estimates of the nonzero elements of signal x, to a receiver 130.

The processor 110 may be embodied in any device or apparatus required by or appropriate to the circumstances of use. For example, the processor 110 may be included in a computer also having one or more of a volatile memory, a non-volatile storage, a display, a user interface, and one or more communication interfaces. The source 120 and the receiver 130 may respectively be aspects of the computer, or alternatively external to the computer. For example, the source 120 may include the non-volatile storage, and the processor 110 receives data encoding the observation y of signal x from the non-volatile storage. Alternatively, the source 120 may include a communication interface, and the processor 110 receives a signal encoding the observation y of signal x from the communication interface. Similarly, the receiver may include the non-volatile storage or a communication interface, and the processor 110 stores or sends the index subset $\mathcal{J}$, and optionally the signal estimate subset $\hat{x}_{\mathcal{J}}$, in or via the non-volatile storage or communication interface, respectively.

The processor 110 may be a digital signal processor or an integrated circuit, and/or may be included in or form an aspect of a general purpose computer, or alternatively a special purpose device. For example, in a communications application the processor 110 may be included in or form an aspect of a base station, a router, an access point, a switch, or a hub configured for wired or wireless communication with one or more devices over a network which may include a wired or wireless network. The processor 110 may be a general-purpose processor configured to execute instructions encoded in a memory to perform the methods described herein, or alternatively the processor 110 may be a special-purpose circuit configured to perform the methods, and may be, for example, an application-specific integrated circuit. The processor 110 may include one or more processors which are configured cooperatively to execute the instructions or perform the methods, or are alternatively configured such that each processor executes a different portion of the instructions or a different step of aspect of the method. Accordingly, the term "processor" as used herein may be understood as including one or more processors, which may be selected based on related design and performance considerations.

The processor 110 may input or receive the observation y in any convenient form or format, and may output or send the index subset $\mathcal{J}$, and optionally the signal estimate subset $\hat{x}_\mathcal{J}$, in any convenient form or format. For example, the processor 110 may receive the observation y in the form of a data packet, and/or may output or send the index subset $\mathcal{J}$, and optionally the signal estimate subset $\hat{x}_\mathcal{J}$, in the form of a packet.

A method 200 performable by the processor 110 is now described.

In general, observation y and signal x are related by:

$$y = Ax + z \qquad (3)$$

wherein A is an observation matrix, and z represents noise. If the system is noiseless, or may be presumed to be so, or if noise is negligible, then noise z may be omitted or set to zero. Observation y and signal x may, in principle, have any dimensionality, thus determining the dimensionality of observation matrix A and noise z, where the system may be underdetermined. For the sake of convenient exposition, it will be assumed that observation y, signal x, and noise z are one-dimensional vectors, and observation matrix A is a two-dimensional matrix, though it will be appreciated that the principles set forth herein are equally applicable regardless of dimensionality.

Thus, in the method, a signal vector $x_{n \times 1}$ is known, determined, or estimated to be s-sparse—that is a relatively small number s<<n elements of signal vector $x_{n \times 1}$ are nonzero. A number m of observations $y_{m \times 1}$ of a signal encoding vector $x_{n \times 1}$ are input, or received (step 210), wherein s<m<n, and are related as follows:

$$y_{m \times 1} = A_{m \times n} x_{n \times 1} + z_{m \times 1} \qquad (4)$$

where $A_{m \times n}$ is the observation matrix, and $z_{m \times 1}$ represents noise.

Using a compressed sensing optimization algorithm, an estimate $\hat{x}$ of signal x may be generated (step 220). The compressed sensing algorithm may be any conventional or as yet unknown compressed sensing algorithm. The compressed sensing algorithm may be a Lasso algorithm, such as a least-angle regression algorithm or a coordinate descent algorithm. Alternative compressed sensing algorithms may also be used.

Based on the signal estimate $\hat{x}$, an index set $\mathcal{K} = \{i_1, i_2, \ldots, i_k\}$ of a number k of potentially nonzero elements of signal x is generated, wherein k is no greater than the number of observations m in observation vector y, that is k≤m. As such:

$$\mathcal{K} \subset \{1,2,\ldots,n\}, |\mathcal{K}| \leq |y| \qquad (5)$$

it being recalled that signal x has n elements.

The value of k—that is the number of potentially nonzero elements—may be selected based on any suitable basis, and may be equal to the number of observations m, one less than the number of observations m−1, or any other quantity less than m. In particular, k may be a design parameter determined based on experiment or any other basis related to the system under consideration.

Having selected the number of potentially nonzero elements k, an index set $\mathcal{K}$ is generated to identify the k most dominant elements of signal estimate $\hat{x}$ according to the sparsifying norm used (step 230), wherein s<k≤m<n. Thus, if an $l_1$ norm is used, then the k most dominant elements of signal estimate $\hat{x}$ are determined to be the k elements $\hat{x}_i$ having the greatest norm $|\hat{x}_i|$. As another example, if an $l_{1,2}$ norm is used as the sparsifying norm, then the k most dominant elements of signal estimate $\hat{x}$ consists of the elements in sub-vectors $x_{\mathcal{G}_i}$, having the greatest $l_2$ norm $\|x_{\mathcal{G}_i}\|_2$ with $\Sigma |\mathcal{G}_i| = k$.

The index set $\mathcal{K}$ thus defines a sub-vector $\hat{x}\mathcal{K}$ of signal estimate $\hat{x}$ including the elements corresponding to index set $\mathcal{K}$, and similarly a sub-matrix $A\mathcal{K}$ including columns corresponding to index set $\mathcal{K}$. The number of elements k of signal vector estimate $\hat{x}\mathcal{K}$ is no greater than the number of measurements m in matrix $A\mathcal{K}$—that is, k≤m—and thus the optimization problem is no longer underdetermined and may be solved by a method which is not limited by the constraint of an underdetermined system.

Thus, based on index set $\mathcal{K}$ and the observation vector y, a non-underdetermined estimation method may be used to find the nonzero elements among the k potentially nonzero elements. In some embodiments, the non-underdetermined estimation method is an iterative linear minimum mean-square error (LMMSE). Other non-underdetermined estimation methods may also be used. In other embodiments, for example, a zero-forcing (ZF) estimation method may be used. In particular, the estimation method generates an iteration index subset $\mathcal{J} \subset \mathcal{K}$ of the nonzero elements of signal estimate $\hat{x}$ along with the element estimates $\hat{x}_\mathcal{J}$ (step 240). In some embodiments, selection of k<m may result in improved performance of the LMMSE algorithm, which may result in a lower estimation error, i.e. a smaller value of $\|\hat{x}_\mathcal{J} - x_\mathcal{J}\|_2^2$.

Figure 3:
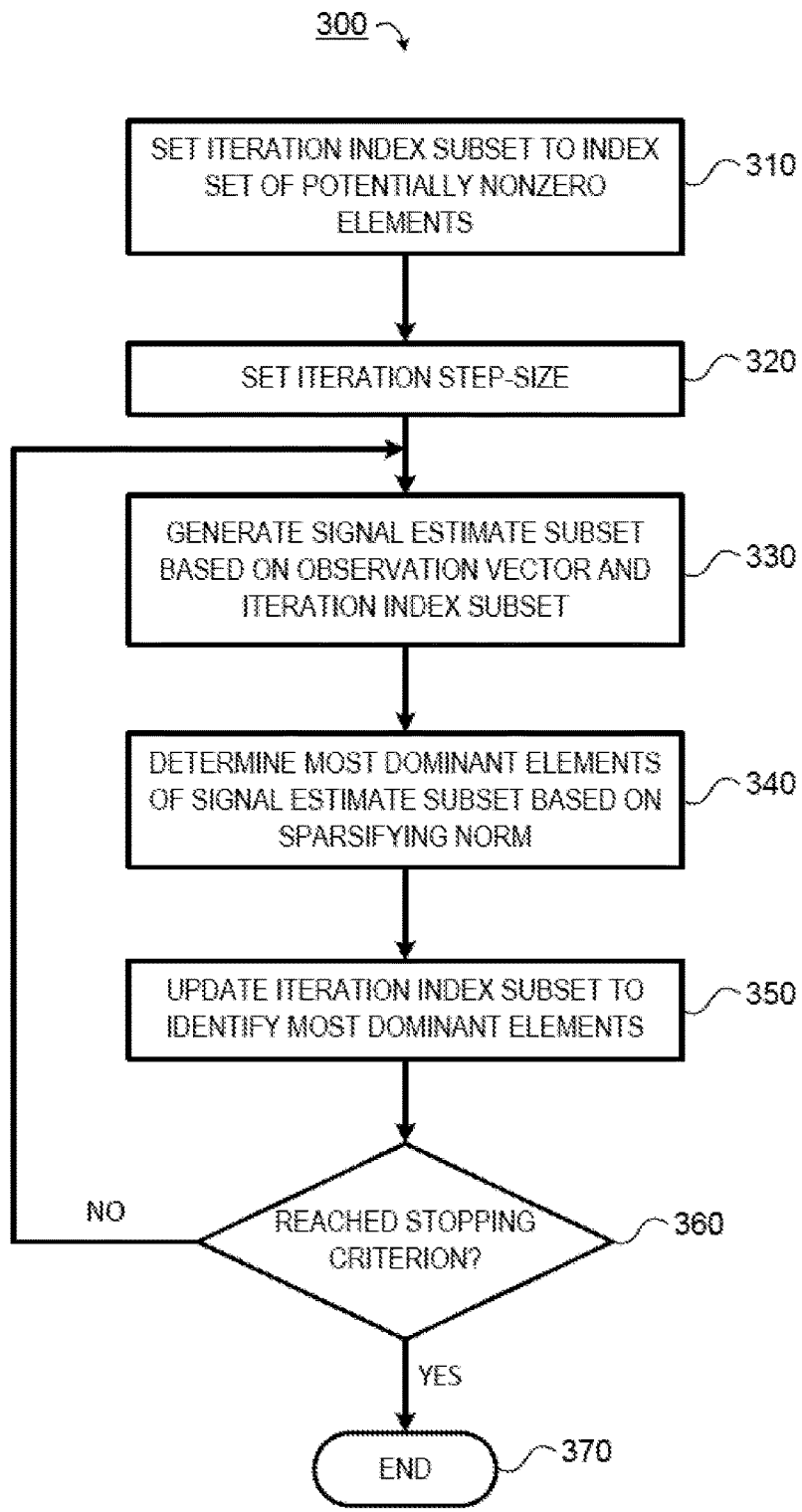
FIG. 3 is a flowchart of an iterative linear minimum mean-square error optimization algorithm suitable for use in the method of FIG. 2, according to embodiments disclosed herein.

The iterative LMMSE optimization algorithm 300 is now described in more detail with reference to FIG. 3. In the below:

$\hat{x}_\mathcal{J}$ is a sub-vector of $\hat{x}$ including elements corresponding to index set $\mathcal{J}$;

$A_\mathcal{J}$ is a sub-matrix of A including columns corresponding to index set $\mathcal{J}$;

$C_x$ is a covariance matrix of signal vector x; and $C_z$ is a covariance matrix of noise vector z.

In an initialization step of the iterative LMMSE algorithm, $\mathcal{J}$ is set to equal $\mathcal{K}$ (step 310)—that is, $\mathcal{J} \leftarrow \mathcal{K}$—and an iteration step-size $\Delta$ is set (step 320).

The iteration step-size $\Delta$ may be selected on any suitable basis. In some embodiments, it is set to $\Delta = 1$, such that only a single potentially nonzero element is eliminated with each iteration. Alternatively, $\Delta > 1$. In particular, the iteration step-size $\Delta$ may be selected based on any other optimization method, and may be a design parameter determined based on experiment according to the system under consideration.

Having selected an iteration step-size $\Delta$, the following steps are performed in each iteration of the algorithm.

Firstly, a signal estimate subset $\hat{x}_\mathcal{J}$ is generated (step 330), wherein $\hat{x}_\mathcal{J} = W \times y$ and the LMMSE matrix W is given by:

$$W = C_{x_\mathcal{J}} A_\mathcal{J}^H (A_\mathcal{J} C_{x_\mathcal{J}} A_\mathcal{J}^H + C_z)^{-1} \qquad (6)$$

wherein $A_\mathcal{J}^H$ is the conjugate transpose of $A_\mathcal{J}$.

Secondly, the q most dominant elements of $\hat{x}_{\mathcal{J}}$ are then determined, according to the sparsifying norm (step 340), that is:

$$\{i_1, \ldots, i_q\} \subset \mathcal{J}, \text{ wherein } q = \max(|\mathcal{J}| - \Delta, s)$$

Finally, the index subset $\mathcal{J}$ is updated to identify the q most dominant elements of $\hat{x}_{\mathcal{J}}$ thus determined (step 350), that is $\mathcal{J} < \{i_1, \ldots, i_q\}$.

The above steps are performed iteratively until $|\mathcal{J}| \leq s$—that is, while the number of elements of index subset $\mathcal{J}$ is greater than the number of nonzero elements of signal x—or any other stopping criterion has been met (decision 360, end 370). For example, a variance of one or more of the elements of signal estimate subset $\hat{x}_{\mathcal{J}}$ may be determined in each iteration, and the stopping criterion may define a threshold value of the variance. Other alternatives are possible.

In a special case where the respective elements of both the noise and signal vectors are internally uncorrelated, then W simplifies to:

$$W = \left(A_{\mathcal{J}}^H A_{\mathcal{J}} \frac{\sigma_z^2}{\sigma_x^2} I\right)^{-1} A_{\mathcal{J}}^H \quad (7)$$

wherein $\sigma_x$ and $\sigma_z$ are the variances of x and z respectively, and wherein I is the identity matrix of appropriate dimensions.

When the iteration terminates, index subset $\mathcal{J}$ identifies the nonzero elements of signal x, and the signal estimate subset $\hat{x}_{\mathcal{J}}$ is the subset of estimates of the nonzero elements of signal x. The index subset $\mathcal{J}$ may be output, or sent (step 250). Optionally, the signal estimate subset $\hat{x}_{\mathcal{J}}$ may also be output, or sent. In addition, or alternatively, signal x may be recovered (step 260). For example, signal x may be recovered based on on $\hat{x}_{\mathcal{J}}$ and $\mathcal{J}$. Alternatively, having identified the nonzero elements of signal x, in index set $\mathcal{J}$, other methods may be used to reconstruct signal x based on observation vector y and index set $\mathcal{J}$.

Use of a non-underdetermined estimation method in accordance with the method above can improve performance of a compressed sensing algorithm. In particular, an iterative LMMSE iteration has less complexity than a compressed sensing iteration, including where the coordinate descent algorithm is used. For example, each iteration of LMMSE involves one matrix multiplication, whereas each iteration of coordinate descent involves n matrix multiplications, and as such each iteration of LMMSE is less computationally intensive. Moreover, each LMMSE iteration may resolve the nonzero elements of signal x more fully than each compressed sensing iteration, resulting in a more rapid solution at a lower computational cost.

The above system and method for reconstructing signal vector x from observation vector y may be used in any application where x is known or determined to be sparse, and following the application of conventional compressed sensing algorithms there exists some basis for selecting a number of most dominant elements which is no less than the number of measurements. The system and method are not limited in their application to any particular field, but may be used in any application wherein vector x and vector y represent respective phenomena related by equation (3). The system and method may be used in any area of communications or signal processing, including wired or wireless telecommunications, image, video, or audio processing, including as part of image, video, or audio compression and transmission methods.

For example, in one embodiment of a system and method, the observation vector y may represent a measurement of a continuous electromagnetic signal encoding symbols of a sparse digital signal vector x by any modulation scheme A. In another embodiment, y may represent compressed data according to compression scheme A, wherein x is the sparse uncompressed data. For example, y may represent a compressed representation of video, image, or audio data in a representation domain (which may be a frequency domain or wavelet domain, for example), compressed according to compression scheme A, and x represents the uncompressed video, image, or audio data in the representation domain.

The inventors have discovered that the above system and method are also useful for identifying active devices in an overloaded, uncoordinated communication system, as follows.

Figure 4:
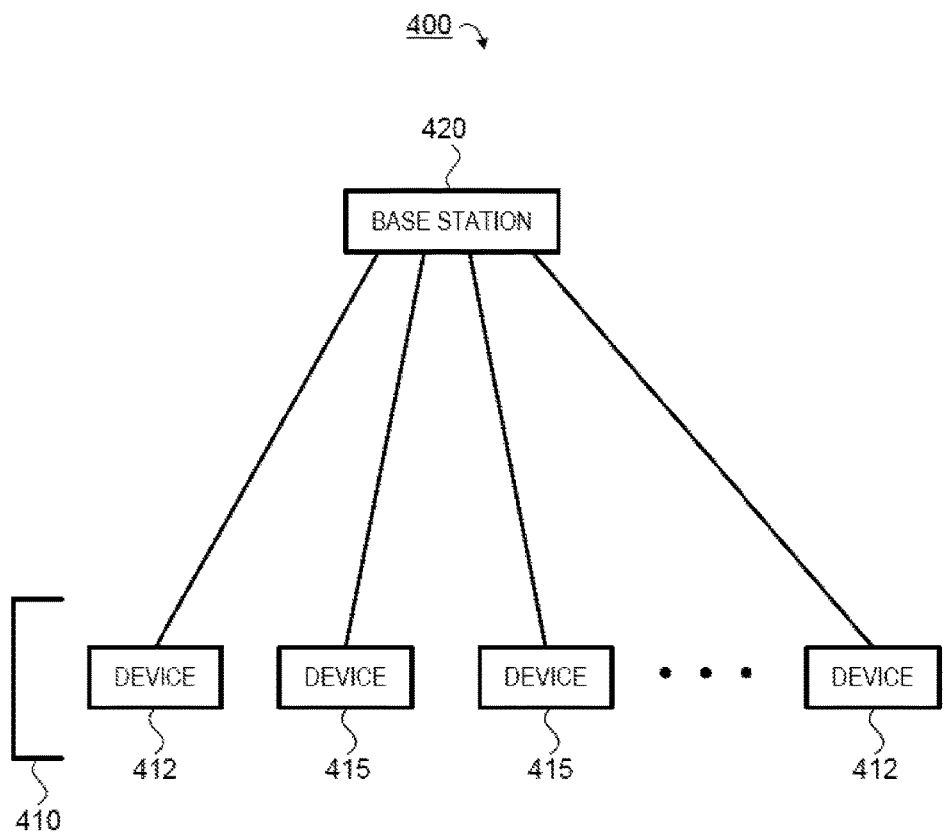
FIG. 4 is a block diagram of an overloaded communications system suitable for performing the method of FIG. 2, according to embodiments disclosed herein.

As shown in FIG. 4, a communications system 400 may include a number of communications devices 410 configured to transmit one or more signals to a base station 420. Transmission from the devices 410 to the base station 420 may be uncoordinated, meaning each of the devices 410 may transmit to the base station 420 autonomously without coordination between the devices 410. For example, there may be no control channels or the like between the base station 420 and the devices 410 to coordinate communications. One or more of the devices 410 may be active devices 415 at a given time, meaning that they are transmitting at that time, and the remaining devices 410 may be inactive devices 412, meaning that they are not transmitting at that time.

For example, the communications devices may include one or more digital radios, cellular telephones, smartphones, tablet computers, laptop computers, smart appliances, smart devices, or any other device having a transmitting capability. The base station is configured to receive transmissions from the communications devices. For example, the base station may include processor 110 and source 120, wherein source 120 includes a communication interface of the base station which receives transmissions from active devices 415.

If in such a system the number of devices is no greater than a number of channels available for communication with the base station, and each of the devices is assigned to a different channel, then the base station is capable at any time of determining which devices are active (i.e. transmitting) by simply observing through which channel a signal is being received. In the case where the number of devices is greater than the number of available channels, however, the system is overloaded, and the base station cannot determine which devices are active in this way.

For example, a communications system employing a code division multiple access (CDMA) channel access method enables synchronous or asynchronous simultaneous transmission of multiple signals over a single communications channel by modulating each signal according to a code, or signature. So long as the set of signatures are mutually orthogonal, all of the signals are in principle recoverable. The set of mutually orthogonal signatures is, however, practically limited in number in a given set of conditions, and thus as the number of communicating devices in such a system increases, and each new device is assigned a new signature, a point is reached where the set of signatures is no longer completely mutually orthogonal. Such a system is said to be 'overloaded'.

An overloaded system of the kind described above may be modeled by:

$$y_{m \times p} = A_{m \times n} x_{n \times p} \quad (8)$$

wherein vector $y_{m \times p}$ stands for a number p of symbols received in a number m channels, from a number n devices $x_{n \times p}$, according to an encoding operator $A_{m \times n}$. For example, in a CDMA system, operator $A_{m \times n}$ stands for the n signatures available for signal modulation and m is the signature length. If n>m devices are assigned n>m corresponding signatures which do not form a mutually orthogonal set, the system is overloaded and it cannot be determined which device is transmitting at any given time simply by reference to the channel.

If, however, it is known or expected that only a relatively small number s of the devices is active (i.e. transmitting) at any given time, that is s<<n, then the above methods for recovering an s-sparse signal x from an underdetermined set of m observations y may be employed to determine the number s active devices in the overloaded system.

Thus, it is assumed that, at a given time, a number s of the n devices is active, and for the sake of convenient exposition it is assumed that each device transmits a single symbol at a given time. This is the situation, for example, in a synchronous communication system. It will be appreciated, however, that the principles herein are equally applicable where more than one symbol is transmitted. The symbols may be encoded in the transmission signal in any desired manner, and thus the symbols may be encoded by quadrature phase-shift keying (QPSK) modulation. An observation $y_{m \times 1}$ is thus related to the transmitted symbols $x_{n \times 1}$ by:

$$y_{m \times 1} = A_{m \times n} x_{n \times 1} + z_{n \times 1} \quad (9)$$

wherein n is the number of devices, m is the signature length, $A_{m \times n}$ is the encoding operator, and $z_{n \times 1}$ represents noise. If the system is or may be presumed to be noiseless, or noise is negligible, then $z_{n \times 1}$ may be omitted or set to zero. The signature length is less than the number of devices, that is m<n, and the system is overloaded. It is known or expected that the number s of active devices is small, that is s<<n, and is less than the signature length, that is s<m.

Figure 5:
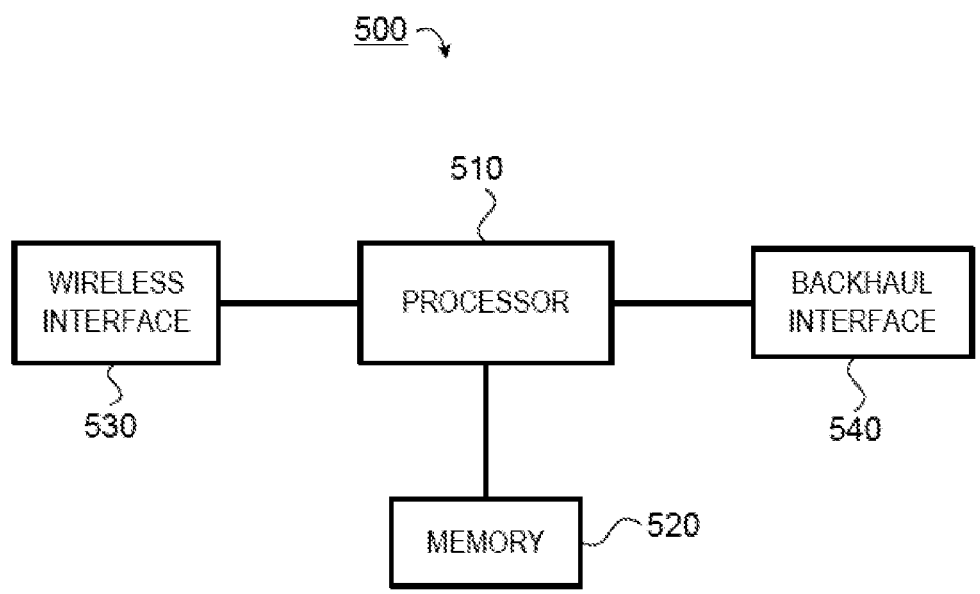
FIG. 5 is a block diagram of a base station suitable for performing the method of FIG. 2, according to embodiments disclosed herein.

Based on the foregoing definitions, therefore, the system and method of recovering a sparse signal from an underdetermined set of measurements is made equally applicable for determining the s<<n active devices transmitting autonomously to a base station at a given time. Thus, with reference to FIG. 5, a base station 500 may include a processor 510, which may be or include processor 110, a memory 520, a wireless interface 530, and a backhaul interface 540. Base station 500 may interface with source 120 and/or receiver 130, or these may be included as aspects or components of base station 500. For example, wireless interface 530 may be or include source 120, and may be configured to receive transmissions from devices 410 and generate observations $y_{m \times 1}$ for receipt by processor 510 of the base station. Receiver 130 may include any aspect or device for receiving index subset $\jmath$, and optionally signal estimate subset $\hat{x}\jmath$, following performance of the method 200 by processor 510. In particular, processor 510 may be further configured to recover transmitted symbols $x_{n \times 1}$ from observations $y_{m \times 1}$, based on index subset $\jmath$ generated by method 200.

In application of the method, k may initially be set as the number of potentially active devices, and the index set $\varkappa$ of most dominant elements of vector $x_{n \times 1}$ may represent the set of potentially active devices, that is those devices for which the corresponding transmitted symbol is nonzero. The value of k may be set on the bases set forth above, and in the present application may also be set on the basis of any known factors of the set n of devices in the system which would suggest an upper bound on the number of devices that are active at a given time. Following application of the method, and in particular the last iteration of the LMMSE algorithm, index subset $\jmath$ identifies the s devices for which the decoded symbols $x\jmath$ are nonzero, and thus identifies the s devices which are active.

Figure 6:
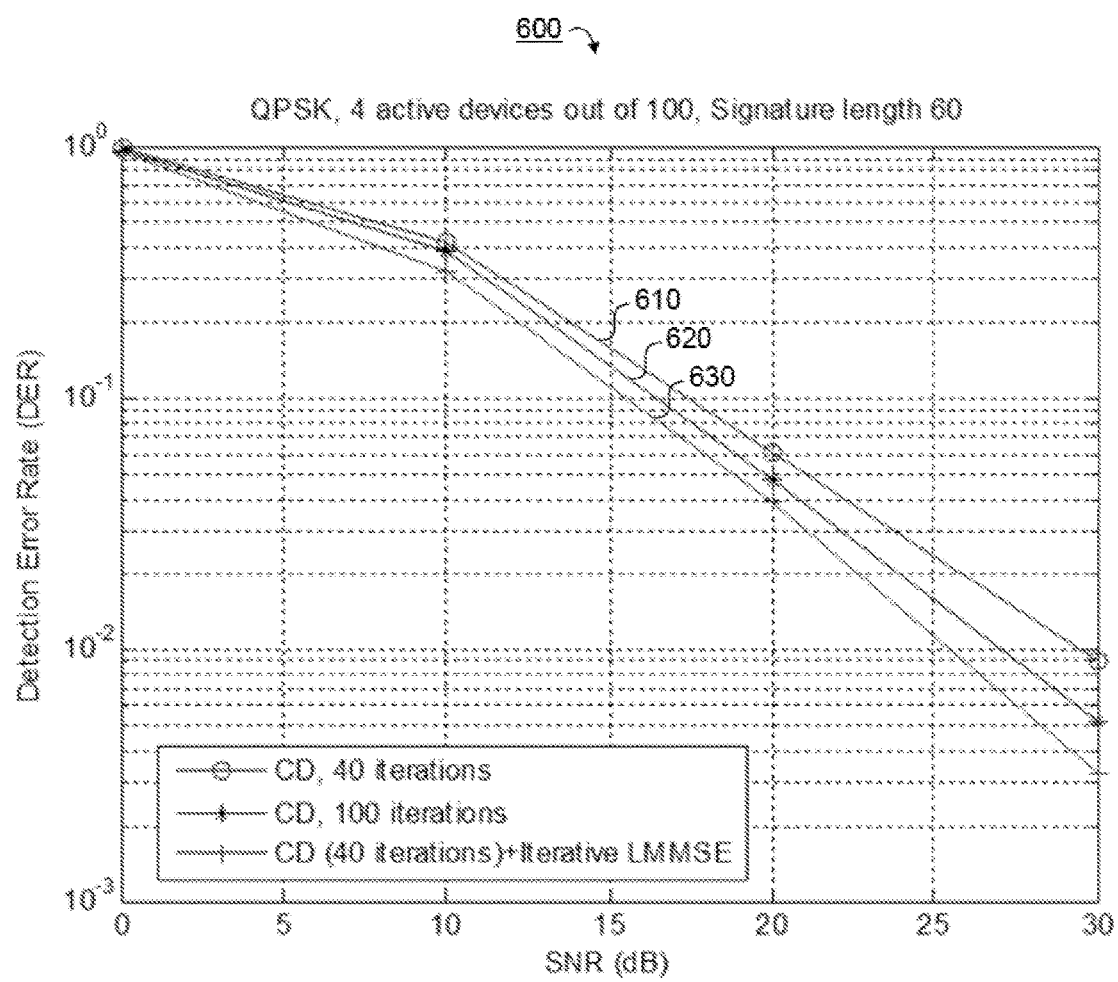
FIG. 6 is a chart showing results of a simulation illustrating performance of the method of FIG. 2 in identifying active devices as compared to conventional methods, according to embodiments disclosed herein.

Reference is made to FIG. 6 which shows a chart 600 illustrating the results of a simulation of the method for identifying active devices. In the simulation, 4 out of a pool of 100 devices are known to be active, though it is not known which ones they are. The simulation models the transmission by the 4 active devices of a single symbol encoding using QPSK modulated with a signature having a length of 60. The simulation models a fading channel, that is channel interference. Accordingly, with reference to equation (4), in the simulation s=4, m=60, and n=100, and thus obey the condition s<m<n. As shown in FIG. 6, three different optimization methods 610, 620, 630 are employed and compared. In a first alternative 610, 40 iterations of a coordinate descent Lasso compressed sensing optimization ("CD") are used. In a second alternative 620, 100 iterations of CD are used. In a third alternative 630, method 200 is used, wherein 40 iterations of CD are used in step 220 followed by iterative LMMSE as set forth in the method 200, wherein the initial number of possibly active devices is set to k=16, and the iteration step-size is set to Δ=1, thus resulting in 12=16−4 iterations of the LLMSE optimization. Chart 600 shows results for different signal-to-noise ratios of the transmitted symbols, as against simulated detection error rate, which is the rate of any detection error in the trial. As is clearly shown in the chart 600, the alternative 630 representing the results of method 200 consistently produces a lower detection error rate for all signal-to-noise ratios as compared to the use of CD alone in alternatives 610, 620, even when a greater number of iterations of CD are used in the second alternative 620.

In another embodiment, a non-volatile computer-readable medium encoding instructions executable by a processor may perform a method as follows. At the processor, an observation vector is received, the observation vector comprising a set of observations of a signal encoding a signal vector, which may be a sparse signal vector. The signal vector has a number of nonzero elements. A number of elements of the observation vector is less than a total number of elements of the signal vector. In some embodiments, and in some embodiments is also greater than the number of nonzero elements of the signal vector. A signal vector estimate is generated by the processor based on the observation vector and an observation matrix using compressed sensing optimization, the observation matrix describing a relationship between the observation vector and the signal vector. An index set of most dominant elements of the signal vector estimate is determined by the processor according to a sparsifying norm, wherein a number of the most dominant elements is at most the number of the elements of the observation vector, and in some embodiments is also greater than the number of the nonzero elements of the signal vector. An index set of the nonzero elements of the signal vector is generated by the processor by performing a non-underdetermined estimation method, such as iterative LMMSE optimization, based on the observation matrix, the observation vector, and the index set of the most dominant elements of the signal vector estimate.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a tangible machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), USB flash disk, or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A method comprising:
    receiving, at a processor, an observation vector comprising a set of observation of a signal;
    generating, by the processor, a signal vector estimate based on the observation vector and an observation matrix using compressed sensing optimization;
    determining, by the processor, an index set of most dominant elements of the signal vector estimate according to a sparsifying norm, wherein a number of the most dominant elements is at most the number of elements of the observation vector; and
    generating, by the processor, an index set of nonzero elements of a signal vector by performing a non-underdetermined estimation method based on the observation matrix, the observation vector, and the index set of the most dominant elements of the signal vector estimate.

2. The method according to claim 1, wherein the signal encodes the signal vector, and the number of the elements of the observation vector is less than a total number of elements of the signal vector.

3. The method according to claim 1, wherein the number of elements of the observation vector is greater than the number of nonzero elements of the signal vector.

4. The method according to claim 3, wherein the number of the most dominant elements is greater than the number of the nonzero elements of the signal vector.

5. The method according to claim 1, wherein the number of the most dominant elements is less than the number of the elements of the observation vector.

6. The method according to claim 1, wherein the observation matrix describes a relationship between the observation vector and the signal vector.

7. The method according to claim 1, wherein the non-underdetermined estimation method is an iterative linear minimum mean square error ("LMMSE") estimation method, wherein in each iteration of the LMMSE estimation method the processor generates a signal vector estimate subset based on the observation vector and an iteration index set, and determines an iteration index subset of most dominant elements of the signal vector estimate subset according to the sparsifying norm, wherein in each iteration a size of the iteration index subset is less than a size of the iteration index set by a predefined step-size, wherein in a first iteration the iteration index set is the index set of the most dominant elements of the signal vector estimate, and wherein in each successive iteration the iteration index set is the iteration index subset of an immediately preceding iteration.

8. The method according to claim 7, wherein the nonzero elements of the signal vector are elements of the signal vector estimate subset following a last iteration of the LMMSE estimation method.

9. The method according to claim 8 further comprising:
    recovering the signal vector based on the index set of the nonzero elements of the signal vector and the elements of the signal vector estimate subset following the last iteration of the LMMSE estimation method; and
    outputting the signal vector.

10. The method according to claim 8, wherein in each iteration of the LMMSE estimation method the signal vector estimate subset is determined by:

$$\hat{x}_{\mathcal{J}} = W \times y,$$

wherein $$W = C_{x_\mathcal{J}} A_\mathcal{J}^H (A_\mathcal{J} C_{x_\mathcal{J}} A_\mathcal{J}^H + C_z)^{-1},$$

wherein
    $\mathcal{J}$ is the iteration index set,
    $\hat{x}_\mathcal{J}$ is the signal vector estimate subset corresponding to iteration index set $\mathcal{J}$,
    y is the observation vector,
    $C_{x_\mathcal{J}}$ is a covariance matrix of vector subset $x\hat{x}_\mathcal{J}$,
    $A_\mathcal{J}$ is an observation sub-matrix corresponding to iteration index set $\mathcal{J}$;
    $A_\mathcal{J}^H$ is a conjugate transpose of observation sub-matrix $A_\mathcal{J}$; and
    $C_z$ is a covariance matrix of a noise vector z.

11. The method according to claim 1 further comprising:
    outputting the index set of the nonzero elements of the signal vector.

12. The method according to claim 1, wherein the sparsifying norm is an $l_1$ norm.

13. The method according to claim 1, wherein the compressed sensing optimization optimizes a least absolute shrinkage and selection operator ("Lasso").

14. The method according to claim 13, wherein the compressed sensing optimization is a coordinate descent optimization of the Lasso.

15. The method according to claim 1, wherein the processor comprises a digital signal processor.

16. The method according to claim 1, wherein the observation vector encodes a compressed form of the signal vector, and wherein the observation matrix defines a compression scheme.

17. The method according to claim 16, wherein the observation vector encodes a compressed representation of video, image, or audio data in a representation domain, and the signal vector encodes an uncompressed representation of the video, image, or audio data in the representation domain.

18. The method according to claim 17, wherein the representation domain is a frequency domain or a wavelet domain.

19. The method according to claim 1, wherein the observation vector encodes an observation of modulated symbols received from a first plurality of transmitting devices, wherein the observation matrix encodes a plurality of symbol modulation signatures, and wherein the signal vector identifies the transmitting devices among a larger plurality of devices including a second plurality of non-transmitting devices.

20. The method according to claim 1, wherein the estimation method is performed until a stopping criterion is met.

21. The method according to claim 20, wherein the stopping criterion is met when the index set of the nonzero elements of the signal vector is determined.

22. An apparatus comprising a processor configured:
to receive an observation vector comprising a set of observations of a signal;
to generate a signal vector estimate based on the observation vector and an observation matrix using compressed sensing optimization;
to determine an index set of most dominant elements of the signal vector estimate according to a sparsifying norm, wherein a number of the most dominant elements is at most the number of elements of the observation vector; and
to generate an index set of nonzero elements of a signal vector by performing a non-underdetermined estimation method based on the observation matrix, the observation vector, and the index set of the most dominant elements of the signal vector estimate.

23. The apparatus according to claim 22, wherein the signal encodes the signal vector, and the number of the elements of the observation vector is less than a total number of elements of the signal vector.

24. The apparatus according to claim 22, wherein the number of elements of the observation vector is greater than the number of nonzero elements of the signal vector.

25. The apparatus according to claim 24, wherein the number of the most dominant elements is greater than the number of the nonzero elements of the signal vector.

26. The apparatus according to claim 22, wherein the observation matrix describes a relationship between the observation vector and the signal vector.

27. The apparatus according to claim 22, wherein the non-underdetermined estimation method is an iterative linear minimum mean square error ("LMMSE") estimation method, wherein in each iteration of the LMMSE estimation method the processor generates a signal vector estimate subset based on the observation vector and an iteration index set, and determines an iteration index subset of most dominant elements of the signal vector estimate subset according to the sparsifying norm, wherein in each iteration a size of the iteration index subset is less than a size of the iteration index set by a predefined step-size, wherein in a first iteration the iteration index set is the index set of the most dominant elements of the signal vector estimate, and wherein in each successive iteration the iteration index set is the iteration index subset of an immediately preceding iteration.

28. The apparatus according to claim 22, wherein the apparatus is included in a base station in wireless communication with a plurality of devices, each element of the signal vector corresponds to a different one of the plurality of devices, each nonzero element of the signal vector represents a symbol transmitted by an active device in the plurality of devices corresponding to the nonzero element, the observation vector represents a number of observations of the symbols transmitted by the active devices, the observation matrix defines modulation signatures associated with the transmitted symbols, and wherein the index set of the nonzero elements of the signal vector identifies the active devices.

29. The apparatus according to claim 22, wherein the number of the most dominant elements is less than the number of the elements of the observation vector.

30. The apparatus according to claim 22, wherein the apparatus is an integrated circuit.

* * * * *